United States Patent [19]
Yanagigawa

[11] Patent Number: 5,767,556
[45] Date of Patent: Jun. 16, 1998

[54] FIELD EFFECT TRANSISTOR

[75] Inventor: Hiroshi Yanagigawa, Ohtsu, Japan

[73] Assignee: NEC Corporation, Tokyo, Japan

[21] Appl. No.: 802,949

[22] Filed: Feb. 21, 1997

[30] Foreign Application Priority Data

Feb. 21, 1996 [JP] Japan .................................. 8-033521
Feb. 21, 1996 [JP] Japan .................................. 8-033522

[51] Int. Cl.[6] .............................. H01L 29/76; H01L 29/94
[52] U.S. Cl. ........................... 257/402; 257/401; 257/404
[58] Field of Search .................................. 257/401, 402, 257/404

[56] References Cited

U.S. PATENT DOCUMENTS 5,317,180  5/1994  Hutter et al. .............................. 257/337
5,366,916  11/1994  Summe et al. .............................. 437/44

FOREIGN PATENT DOCUMENTS 59-121969  7/1984  Japan .

*Primary Examiner*—Valencia Martin Wallace
*Attorney, Agent, or Firm*—Foley & Lardner

[57] ABSTRACT

The invention relates to a field effect transistor that ensures that a threshold voltage does not increase even if a breakdown voltage is increased. The field effect transistor (FET) includes: (a) a first conductivity type semiconductor substrate; (b) a second conductivity type well formed at a surface of the substrate; (c) a first conductivity type well formed at a surface of the second conductivity type well, the first conductivity type well having an impurity concentration profile that varies in a depthwise direction with a maximum impurity concentration located at the deepest vertical position of the first conductivity type well; (d) a second conductivity type source region, formed at a surface of the first conductivity type well; (e) a second conductivity type drain region formed at a surface of the second conductivity type well; (f) a gate insulating film, formed at a surface of the first conductivity type semiconductor substrate between the source and drain regions; (g) a gate electrode, formed on the gate insulating film; (h) a source electrode, formed on the source region; and, (i) a drain electrode, formed on the drain region.

18 Claims, 6 Drawing Sheets

FIELD EFFECT TRANSISTOR

BACKGROUND OF THE INVENTION

1. Field of the Invention

The invention relates to a field effect transistor (hereinafter, referred to simply as "FET"), and more particularly to a horizontal type field effect transistor provided with a high breakdown voltage.

2. Description of the Related Art

With reference to FIG. 1, there is explained hereinbelow an offset type, horizontal type FET, which is a typical example of horizontal type FETs having a high breakdown voltage.

A p-type silicon substrate 1 is formed partially at a principal plane 1a thereof with a p-type well 2 into which p-type impurities are doped more heavily than the p-type silicon substrate 1. At a surface of the p-type well 2 is formed an offset layer 3, into which n-type impurities are lightly doped to thereby enhance a breakdown voltage thereof. At a surface of the offset layer 3 is formed drain region 4 into which n-type impurities are heavily doped. A source region 5 is formed at a surface of the p-type well 2 and at a certain distance away from the offset layer 3, into which n-type impurities heavily are doped. There is formed a contact layer 6 within the p-type well 2 and in the vicinity of the source region 5, into which p-type impurities are heavily doped.

There is formed a gate insulating film 7 on the p-type well 2 between the source region 5 and the offset layer 3. A gate electrode 8 is formed on the gate insulating film 7. A source electrode 10 is formed on a surface of the semiconductor substrate 1 across the source region 5 and the contact layer 6, and a drain electrode 11 is formed on the drain region 4. There is deposited a field oxide film 9 on a surface of the semiconductor substrate 1 where the gate electrode 8, the source electrode 10 and the drain electrode 11 do not cover the semiconductor substrate 1.

In the illustrated FET, the offset layer 3, into which n-type impurities are lightly doped, surrounds the drain region 4. When a backward voltage is applied across the source region 5 and the drain region 4, an electric field is intensified at an edge 3a of the offset layer 3. However, since the offset layer 3 has a low impurity concentration, a breakdown voltage at the edge 3a is higher than a breakdown voltage at the edge 4a of the drain region 4,into which impurities have been more heavily doped than the offset layer 3, in a FET in which the offset layer 3 has not formed.

Another example for enhancing a breakdown voltage characteristic is a double-reserve type, horizontal type FET, which will be explained hereinbelow with reference to FIG. 2.

A p-type silicon substrate 21 is formed at a principal plane 21a thereof with a n-type well 22 into which n-type impurities are doped. At a surface of the n-type well 22 is formed a p-type well 23 into which p-type impurities are doped. A source region 24, into which n-type impurities are heavily doped, is formed at a surface of the p-type well 23, and a drain region 25, into which n-type impurities are heavily doped, is formed at a surface of the n-type well 22 and at a certain distance away from the p-type well 23. A contact layer 26, into which p-type impurities are heavily doped, is formed at a surface of the p-type well 23. A p-type diffusion layer 27 into which p-type impurities are diffused is formed at a surface of the n-type well 22 between the source region 24 and the drain region 25. The p-type diffusion layer 27 is designed to be in electrical connection with the p-type silicon substrate 21 so that they are kept at the same voltage. The n-type well 22, sandwiched between the p-type diffusion layer 27 and the p-type silicon substrate 21, is called an extended drain region 28.

There is formed a gate insulating film 29 on the p-type well 23 between the source region 24 and the n-type well 22. A gate electrode 30 is formed on the gate insulating film 29. A source electrode 32 is formed on a surface of the semiconductor substrate 21 across the source region 24 and the contact layer 26, and a drain electrode 33 is formed on the drain region 25. There is deposited a field oxide film 31 on the principal plane 21a where the gate electrode 30, the source electrode 32, and the drain electrode 33, do not cover the principal plane 21a of the semiconductor substrate 21.

In the above mentioned FET illustrated in FIG. 2, the p-type diffusion layer 27 is formed at a surface of the n-type well 22 between the source region 24 and the drain region 25 in order to relax an electric field generated between the source and drain regions 24, 25. Thus, when a backward voltage is applied across the source region 24 and the drain region 25, depletion layers spread within the extended drain region 28 from both the p-type silicon substrate 21 and the p-type diffusion layer 27. These depletion layers meet to become continuous with each other. Hence, the extended drain region 28 acts as a layer for relaxing the electric field, resulting in a breakdown voltage characteristic that is enhanced.

FIG. 3 illustrates still another example of a horizontal type FET. A p-type silicon substrate 41 is formed partially at a principal plane 41a thereof, with a n-type well 42 formed by ion-implanting n-type impurities thereto followed by thermal diffusion. At a surface of the n-type well 42 is formed a p-type well 43 by ion-implanting p-type impurities thereto followed by thermal diffusion. There is formed a source region 44 partially at a surface of the p-type well 43 by heavily ion-implanting n-type impurities. There is formed a drain region 45 at a surface of the n-type well 42 and at a certain distance away from the p-type well 43 by heavily ion-implanting n-type impurities.

There is formed a gate insulating film 46 across the source region 44, the p-type well 43, the n-type well 42 and the drain region 45 by thermal oxidation of a surface of the p-type well 43 between the source region 44 and the n-type well 42. On the gate insulating film 46 is formed a gate electrode 47 made of a polysilicon layer formed by chemical vapor deposition (CVD). A source electrode 49 is formed on the source region 44, and a drain electrode 50 is formed on the drain region 45, both by sputtering. The source electrode 49 and the drain electrode 50 are made of aluminum. There is formed a field oxide film 48 by thermal oxidation covering the principal surface 41a of the p-type silicon substrate 41 where the gate electrode 47, the source electrode 49 and the drain electrode 50 do not cover the principal plane 41a of the p-type silicon substrate 41.

An impurity concentration profile in a depthwise direction from a point A, located just below a surface of the source region 44, to a point B, located within the p-type silicon substrate 41 is illustrated in FIG. 4, in which d44, d43, d42 and d41 indicate an impurity concentration profile in the source region 44, the p-type well 43, the n-type well 42 and the p-type silicon substrate 41, respectively.

An impurity concentration profile in a horizontal direction from the point A to a point C located just below a surface of the drain region 45 is illustrated in FIG. 5, in which w44, w43, w42 and w45 indicate an impurity concentration profile in the source region 44, the p-type well 43, the n-type well 42 and the drain region 45, respectively.

In a double diffusion structure in which the p-type well 43, the source region 44 and the drain region 45 are self-aligned with the gate electrode 47 being used as a common mask, a maximum impurity concentration at a surface of the p-type well 43 acting as a channel is found in the vicinity of a junction plane 43a of the source region 44 to the principal plane 41a, as seen in FIGS. 4 and 5. A threshold voltage is determined in dependence on the maximum impurity concentration.

Impurities have a shorter diffusion length for horizontal diffusion than a diffusion length for vertical diffusion or depthwise direction diffusion. In addition, the impurity concentration in the p-type well 43 becomes lower at a location closer to the n-type well 42. Thus, punch through in the p-type well 43 tends to take place in the vicinity of the principal plane 41a. In order to prevent occurrence of punch through, the p-type well 43 is required to have a high impurity concentration at a surface thereof and to be deep, and it is further required to be long in order to sufficiently act as a channel. Accordingly, the FET illustrated in FIG. 3 has a problem that it is impossible to lower a threshold voltage.

Furthermore, the FET illustrated in FIG. 3 poses another problem that a dispersion in diffusion in the p-type well 43 and the source region 44 brings a dispersion in the maximum impurity concentration in the vicinity of the junction plane 43a, resulting in an increased dispersion in a threshold voltage.

The above mentioned offset type, horizontal type FET illustrated in FIG. 1 has a problem that the presence of the offset layer 3 causes a resistance between the source region 5 and the drain region 4 to become greater, resulting in an increase ON-resistance.

In the above mentioned double reserve type, horizontal type FET illustrated in FIG. 2, since the p-type diffusion layer 27 is located intermediate between the source region 24 and the drain region 25, a distance between the source region 24 and the drain region 25 cannot be avoidable to be longer with the result of an increased resistance between the source region 24 and the drain region 25. Hence, the FET illustrated in FIG. 2 also has a problem of an increased ON-resistance.

For another example, Japanese Unexamined Patent Publication No. 59-121969 12169 has suggested a CMOS semiconductor device including a first conductivity type semiconductor substrate, a second conductivity type well formed in the semiconductor substrate, a first MOS transistor formed on the second conductivity type well, and a second MOS transistor formed on the semiconductor substrate. An impurity concentration in the second conductivity type well is designed to be higher inside thereof than at a surface thereof by ion-implanting second conductivity type impurities to the well in parallel with a direction in which a crystal axis of the semiconductor substrate extends.

U.S. Pat. No. 5,317,180 issued on May 31, 1994 to Hutter et al., has suggested an integrated circuit wherein bipolar, CMOS and DMOS devices, are merged together on one chip with fabrication taking place from a CMOS point of view rather than from a bipolar point of view, and p-type epitaxial silicon is used.

U.S. Pat. 5,366,916 issued on Nov. 22, 1994 to Summe et al., has suggested a process of fabricating a high voltage CMOS transistor having a non-self aligned implanted channel which permits the operation of the device at high voltages.

SUMMARY OF THE INVENTION

It is an object of the present invention to provide a field effect transistor which is capable of keeping a threshold voltage low, even if a breakdown voltage is increased, and lessening a dispersion in a threshold voltage by keeping an impurity concentration uniform in the vicinity of the principal plane of a p-type well.

Another object of the present invention is to provide a field effect transistor which is capable of relaxing an electric field and enhancing a breakdown voltage without the ON-resistance being increased.

In one aspect the invention, there is provided a field effect transistor including (a) a first conductivity type semiconductor substrate, (b) a second conductivity type well formed at a surface of the substrate, (c) a first conductivity type well formed at a surface of the second conductivity type well, the first conductivity type well having an impurity concentration profile in a depthwise direction where a maximum impurity concentration is at a depth deeper than a surface of the semiconductor substrate, (d) a second conductivity type source region formed at a surface of the first conductivity type well, (e) a second conductivity type drain region formed at a surface of the second conductivity type well, (f) a gate insulating film formed at a surface of the first conductivity type semiconductor substrate between the source and drain regions, (g) a gate electrode formed on the gate insulating film, (h) a source electrode formed on the source region, and (i) a drain electrode formed on the drain region. The above mentioned FET lowers an impurity concentration at a surface of a p-type well acting as a channel to resultingly lower a threshold voltage.

A further object of the invention is to provide a field effect transistor including (a) a first conductivity type semiconductor substrate, (b) a second conductivity type well formed at a surface of the substrate, (c) a first conductivity type well formed at a surface of the second conductivity type well, the first conductivity type well having an impurity concentration profile in a depthwise direction where a maximum impurity concentration is at a depth deeper than a surface of the semiconductor substrate, (d) a second conductivity type source region formed at a surface of the first conductivity type well, (e) a second conductivity type drain region formed at a surface of the semiconductor substrate so that the drain region lies across the second conductivity type well and the first conductivity type well, (f) a gate insulating film formed at a surface of the first conductivity type semiconductor substrate between the source and drain regions, (g) a gate electrode formed on the gate insulating film, (h) a source electrode formed on the source region, and (i) a drain electrode formed on the drain region.

There is also provided a field effect transistor including (a) a first conductivity type semiconductor substrate, (b) a second conductivity type well formed at a surface of the substrate, (c) a first conductivity type well formed at a surface of the second conductivity type well, the first conductivity type well having impurity concentration profile in a depthwise direction where a maximum impurity concentration is at a depth deeper than a surface of the semiconductor substrate, (d) a second conductivity type source region formed at a surface of the first conductivity type well, (e) a second conductivity type drain region formed at a surface of the second conductivity type well, (f) a gate insulating film formed at a surface of the first conductivity type semiconductor substrate between the source and drain regions, (g) a gate electrode formed on the gate insulating film, (h) a source electrode formed on the source region, and (i) a drain electrode formed on the drain region so that the drain electrode is in electrical connection with the second conductivity type well.

For instance, the impurity concentration of the first conductivity type well may be designed to be higher at a greater depth thereof. For another instance, the maximum impurity concentration of the first conductivity type well may be designed to be found at a depth deeper than the second conductivity type source. This arrangement prevents punch through from occurring below a source region. The maximum impurity concentration of the first conductivity type well may be designed to be located at the bottom thereof. It is preferable that the impurity concentration profile of the first conductivity type well is controlled by ion implantation. Such a control makes an impurity concentration at a surface of a p-type well acting as a channel uniform to thereby lessen a dispersion in a threshold voltage.

There is yet further provided a field effect transistor including (a) a first conductivity type semiconductor substrate, (b) a second conductivity type well formed at a surface of the substrate, (c) a first conductivity type well formed at a surface of the second conductivity type well, (d) a second conductivity type source region formed at a surface of the first conductivity type well, (e) a second conductivity type drain region formed at a surface of the semiconductor substrate so that the drain region lies across the second conductivity type well and the first conductivity type well, (f) a gate insulating film formed on the first conductivity type well between the source region and the drain region, (g) a gate electrode formed on the gate insulating film, (h) a source electrode formed on the source region, and (i) a drain electrode formed on the drain region.

In the above mentioned FET, as a voltage applied to the drain source is increased, the first conductivity type well is converted into a depletion layer. Thus, the first conductivity type well acts as a layer for relaxing an electric field and hence a breakdown voltage is enhanced, but ON-resistance is kept unchanged.

There is still yet further provided a field effect transistor including (a) a first conductivity type semiconductor substrate, (b) a second conductivity type well formed at a surface of the substrate, (c) a first conductivity type well formed at a surface of the second conductivity type well, (d) a second conductivity type source region formed at a surface of the first conductivity type well, (e) a second conductivity type drain region formed at a surface of the first conductivity type well, (f) a gate insulating film formed on the first conductivity type well between the source and drain regions, (g) a gate electrode formed on the gate insulating film, (h) a source electrode formed on the source region, and (i) a drain electrode formed on the drain region so that the drain electrode is in electrical connection with the second conductivity type well.

For instance, the drain electrode is in electrical connection with the second conductivity type well by means of a wire. Herein, the wire is substituted for the drain region formed between the first conductivity type well and the second conductivity type well as found in the previously mentioned FET.

A portion of the first conductivity type well sandwiched between the drain region and the second conductivity type well may be designed to change to a depletion layer in its entirety when a backward voltage is applied across the source and drain regions. This preferred embodiment ensures that a depletion layer extends to an edge of the drain region, resulting in that an electric field intensity at an edge of the drain region is relaxed and hence a breakdown voltage is enhanced without ON-resistance being increased.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 6:
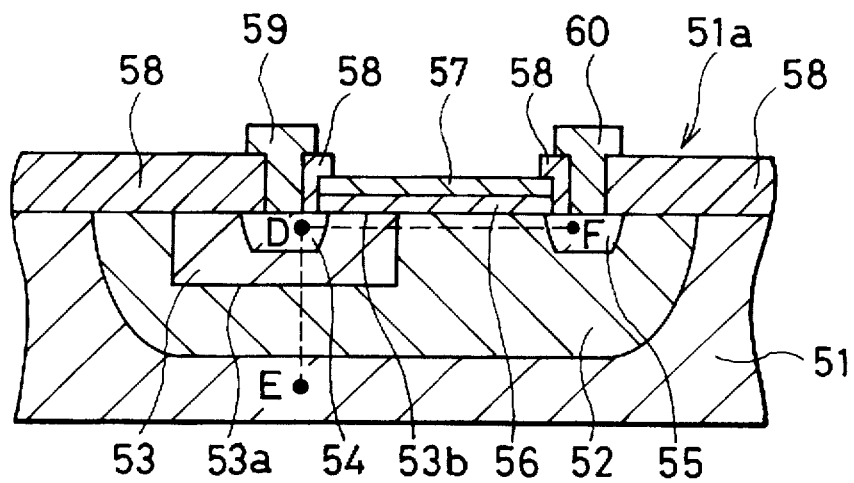
FIG. 6 is a cross-sectional view of a field effect transistor made in accordance with the first embodiment of the present invention.
Figure 7:
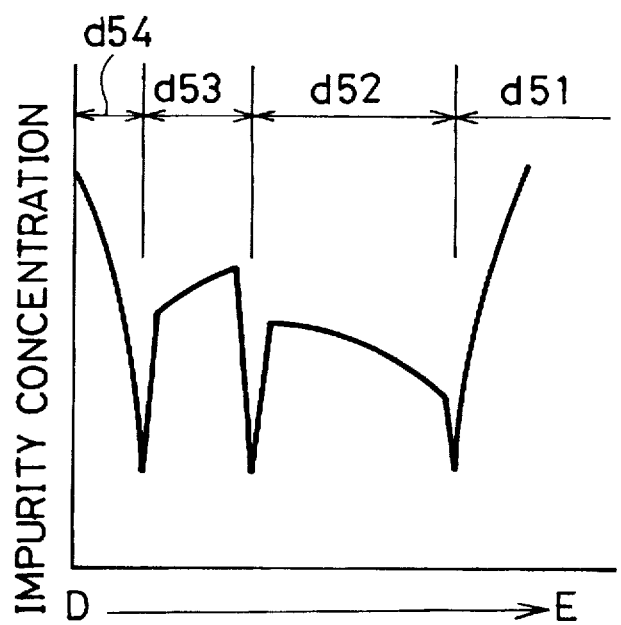
FIG. 7 illustrates an impurity concentration profile between the points D and E in FIG. 6.
Figure 8:
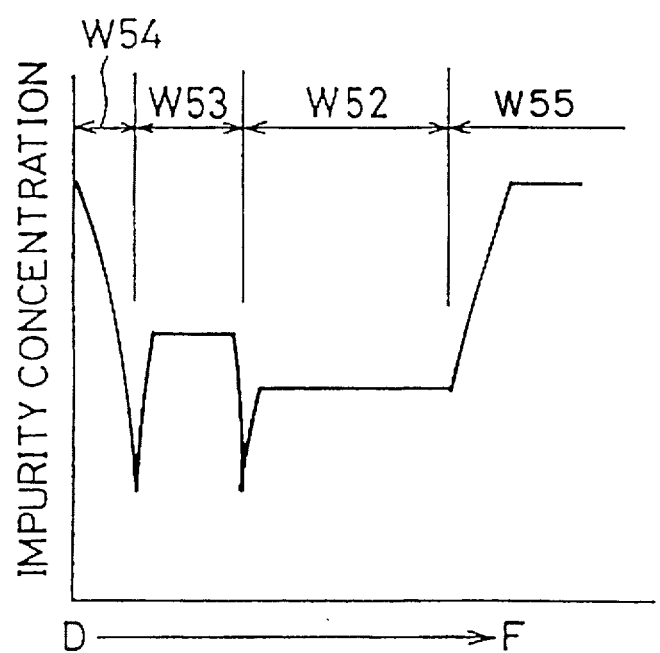
FIG. 8 illustrates an impurity concentration profile between the points D and F in FIG. 6.

With reference to FIGS. 6 to 8, hereinbelow is explained a field effect transistor (FET) made in accordance with the first embodiment of the present invention.

A p-type silicon substrate 51 is formed partially in a principal plane 51a thereof, with an n-type well 52 formed thereon, by ion-implanting n-type impurities thereto, followed by thermal diffusion. At a surface of the n-type well 52 a p-type well 53 is formed by ion-implanting p-type impurities thereto. An impurity concentration in the p-type well 53 is designed to be uniform in a horizontal direction, but varies in a vertical, or depthwise, direction so that a maximum impurity concentration in the p-type well 53 is found at the bottom of the p-type well 53 or in the vicinity of a junction plane 53a between the p-type well 53 and the n-type well 52. Once the impurity concentration profile has been designed, the p-type impurities in the p-type well 53 are not allowed to be re-distributed. There is formed a source region 54 partially at a surface of the p-type well 53 by heavily ion-implanting n-type impurities. There is formed a drain region 55 at a surface of the n-type well 52 and at a certain distance away from the p-type well 53 by heavily ion-implanting n-type impurities.

There is formed a gate insulating film 56 made of silicon dioxide by thermal oxidation across the p-type well 53 and the n-type well 52 between the source region 54 and the drain region 55. On the gate insulating film 56 is formed a gate electrode 57 by growing a polysilicon layer by chemical vapor deposition (CVD) on the gate insulating film 56 followed by phosphorus (P) diffusion into the polysilicon layer by using a gas source to thereby reduce a resistance thereof. A source electrode 59 is formed on the source region 54, and a drain electrode 60 is formed on the drain region 55; both by sputtering. The source electrode 59 and the drain electrode 60 are made of aluminum. There is formed a field oxide film 58 made of a silicon dioxide film covering the principal surface 51a of the p-type silicon substrate 51 at an area where the gate electrode 57, the source electrode 59 and the drain electrode 60 do not cover the principal plane 51a of the p-type silicon substrate 51.

An impurity concentration profile in a depthwise direction from a point D located just below a surface of the source region 54 to a point E located within the p-type silicon substrate 51 is illustrated in FIG. 7, in which d54, d53, d52 and d51 indicate an impurity concentration profile in the source region 54, the p-type well 53, the n-type well 52 and the p-type silicon substrate 51, respectively.

An impurity concentration profile in a horizontal direction from the point D to a point F located just below a surface of the drain region 55 is illustrated in FIG. 8, in which w54, w53, w52 and w55 indicate an impurity concentration profile in the source region 54, the p-type well 53, the n-type well 52 and the drain region 55, respectively.

As shown in FIG. 7, the impurity concentration profile in the p-type well 53 in a vertical, or depthwise direction, increase with depth,or is greater at locations closer to the n-type well 52. Thus, even if a backward voltage is applied across the p-type well 53 and the n-type well 52, punch through does not take place in the p-type well 53 because a depletion layer formed in the p-type well 53 when viewed in a depthwise direction, is small. In addition, since an impurity concentration at a surface of the p-type well 53 is low, it is possible to lower a threshold voltage.

As shown in FIG. 8, since a surface layer 53b of the p-type well 53 has a uniform impurity concentration in a horizontal direction, it is possible to accurately control a threshold voltage, even if there might be a dispersion in diffusion in the source region 54. In addition, the channel length, or a distance between the source region 54 and the n-type well 52, is designed to be a certain length to thereby ensure that punch through does not occur at the surface layer 53b of the p-type well 53.

Those skilled in the art would readily understand that the conductivity types, p- and n-types, may be replaced with reverse conductivity types, n- and p-types, in the above mentioned embodiment.

As explained in a later mentioned embodiment, the drain region 55 may be formed across the n-type well 52 and the p-type well 53.

A field effect transistor made in accordance with the second embodiment is explained hereinbelow with reference to FIG. 9. A p-type silicon substrate 61 is formed partially in a principal plane 61a thereof, with an n-type well 62 formed thereon, by ion-implanting n-type impurities thereto, followed thermal diffusion. At a surface of the n-type well 62, a p-type well 63 is formed by ion-implanting p-type impurities thereto. A source region 64, into which n-type impurities are heavily doped, is formed at a surface of the p-type well 63, and a drain region 65, into which n-type impurities are heavily doped, is formed across the n-type well 62 and the p-type well 63. A contact layer 66, into which p-type impurities are heavily doped, is formed at a surface of the p-type well 63 and in the vicinity of the source region 64.

There is formed a gate insulating film 67 by thermal oxidation on the p-type well 63 across the source region 64 and the drain region 65. A gate electrode 68 is formed on the gate insulating film 67 by making a polysilicon layer grow by CVD. The gate electrode 68 is designed to have a decreased resistance by heavily doping n-type impurities thereinto, using a gas source. A source electrode 70 is formed on the principal plane 61a of the semiconductor substrate 61 across the source region 64 and the contact layer 66, and a drain electrode 71 is formed on the drain region 65, both by sputtering. The source electrode 70 and the drain electrode 71 are made of aluminum. There is deposited a field oxide film 69 on the principal plane 61a by thermal oxidation where the gate electrode 68, the source electrode 70 and the drain electrode 71 do not cover the principal plane 61a of the semiconductor substrate 61.

Figure 1:
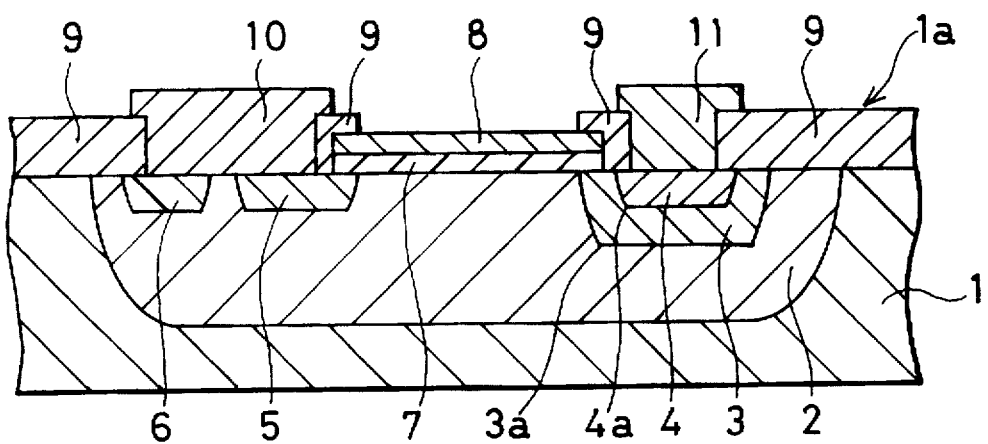
FIG. 1 is a cross-sectional view of a conventional offset type, horizontal type, field effect transistor.
Figure 2:
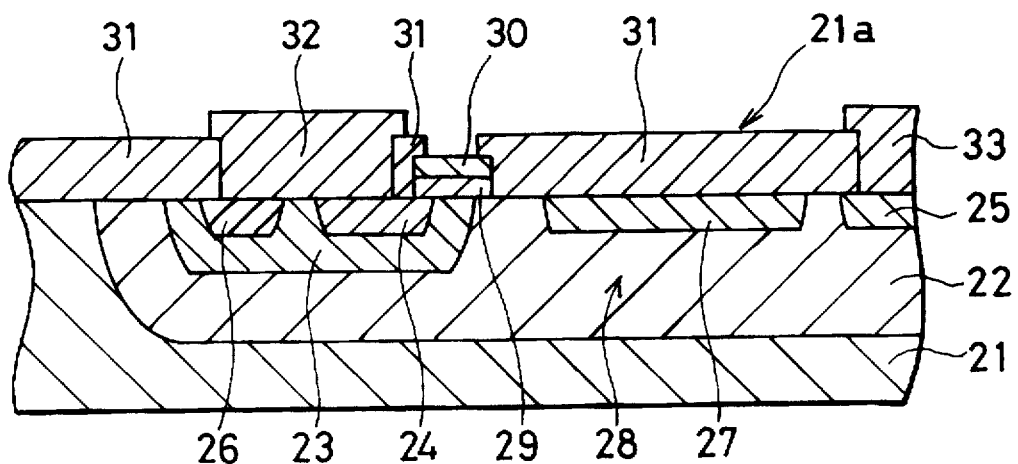
FIG. 2 is a cross-sectional view of a conventional double reserve type, horizontal type, field effect transistor.
Figure 3:
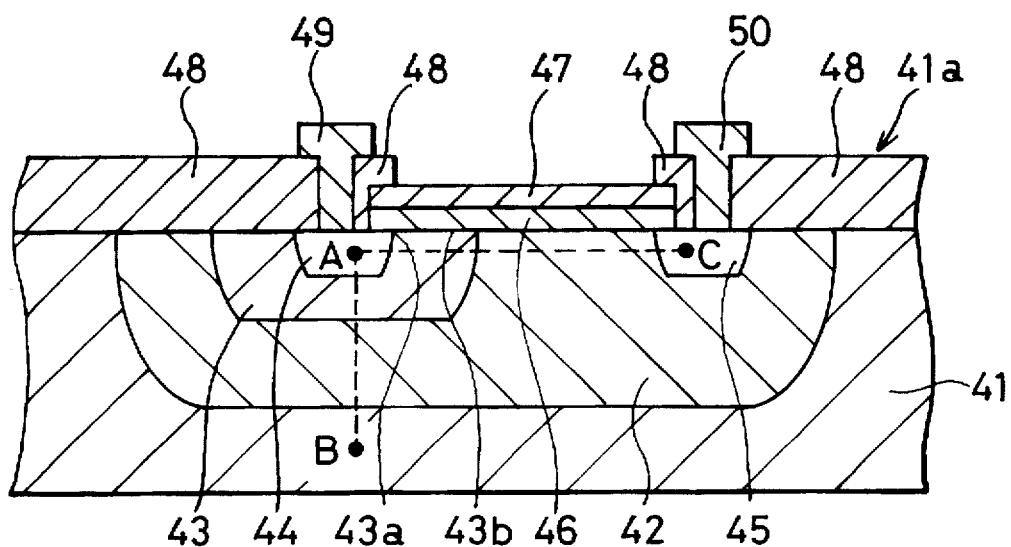
FIG. 3 is a cross-sectional view of another conventional field effect transistor.
Figure 4:
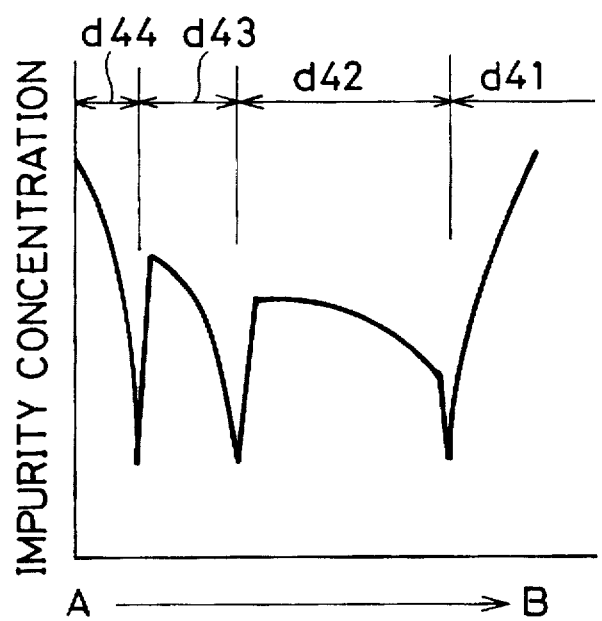
FIG. 4 illustrates an impurity concentration profile between the points A and B in FIG. 3.
Figure 5:
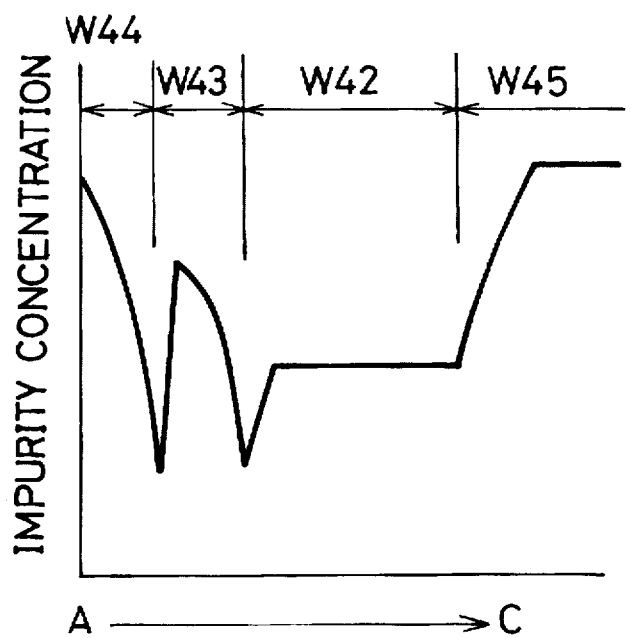
FIG. 5 illustrates an impurity concentration profile between the points A and C in FIG. 3.

In the above mentioned FET, if a voltage applied across the source electrode 70 and the drain electrode 71 is increased, depletion layers spread both from a junction between the drain region 65 and the p-type well 63, and from a junction between the n-type well 62 and the p-type well 63. Then, when a voltage applied across the source electrode 70 and the drain electrode 71 is increased up to a certain voltage, the depletion layers spreading from the above mentioned two junctions meet each other and become continuous with each other, resulting in a portion of the p-type well 63 being sandwiched between a bottom 65a of the drain region 65, and a bottom 63b of the p-type well 63 being entirely changed into a depletion layer. As a result, an electric field intensity at an edge 65b of the drain region 65 is relaxed, and the breakdown voltage is thereby enhanced. A structure between the source region 64 and the drain region 65 at the time when the above mentioned portion of the p-type well 63 is entirely changed into a depletion layer is the same as the structure illustrated in FIG. 1, with the offset layer 3 being omitted therefrom. Thus, a FET, in accordance with the second embodiment, does not increase ON-resistance.

In addition, since the p-type well 63 is formed within the n-type well 62 having a common voltage to the n-type drain region 65, it is possible to electrically separate the p-type well 63 having a common voltage to the source region 64 from the silicon substrate 61, whereby voltages of the source region 64 and the p-type well 63, which will act as a back gate, can be optionally determined. This makes it possible to carry out various applications. For instance, it would be possible to provide a sense resistance between the source electrode 70 and the p-type silicon substrate 61 which is electrically grounded where in use.

Figure 9:
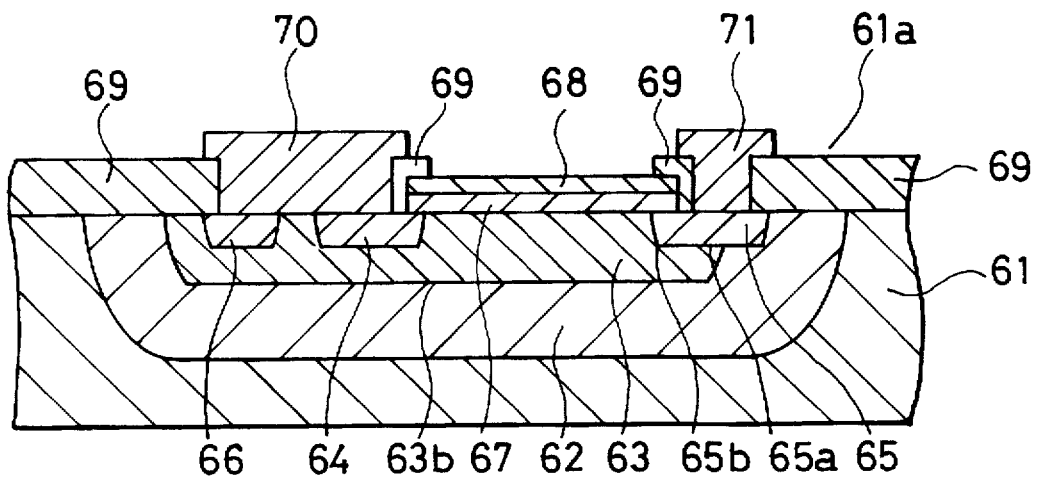
FIG. 9 is a cross-sectional view of a field effect transistor made in accordance with the second embodiment of the present invention.
Figure 10:
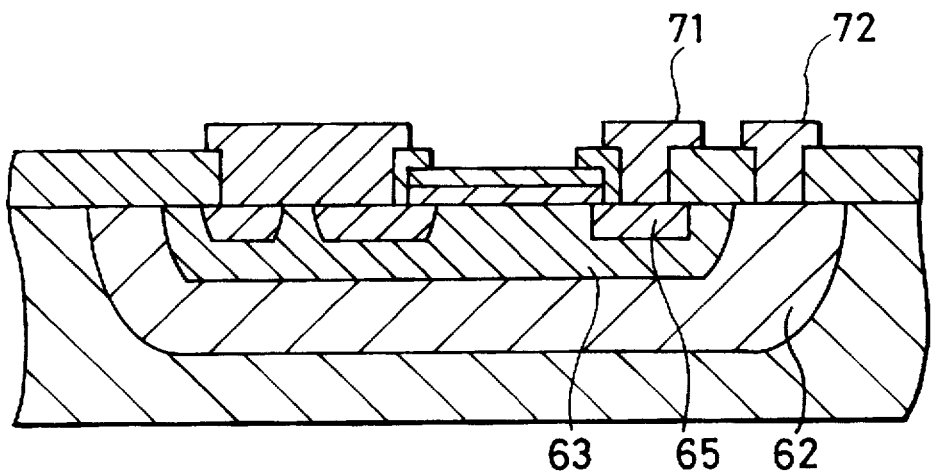
FIG. 10 is a cross-sectional view of a field effect transistor made in accordance with the third embodiment of the present invention.

FIG. 10 illustrates a field effect transistor made in accordance with the third embodiment of the present invention. The illustrated FET has almost the same structure as the structure of FET illustrated in FIG. 9 with the following exceptions.

First, the drain region 65 is formed at a surface of the principal plane 61a within the p-type well 63. The drain electrode 71 is formed on the drain region 65 in a similar manner as the second embodiment.

Second, an additional electrode 72 is formed on an exposed surface of the n-type well 62. The drain electrode 71 is in electrical connection with the electrode 72 by appropriate means such as a metal layer formed over the electrodes 71 and 72.

The illustrated FET operates in the same way as FET illustrated in FIG. 9 and provides the same advantageous effects as those obtained by the FET illustrated in FIG. 9.

As explained in connection with the preferred embodiments, in accordance with the present invention, there is provided a field effect transistor capable of keeping a threshold voltage low, even if a breakdown voltage is increased, and lessening a dispersion in a threshold voltage by keeping an impurity concentration uniform in the vicinity of a principal plane of a p-type well.

In accordance with the present invention, if a voltage applied across a source electrode and a drain electrode is increased, depletion layers spread both from a junction between a drain region and a p-type well and from a junction between a n-type well and a p-type well. Then, when a voltage applied across a source drain and a drain electrode reaches a certain voltage, the depletion layers spreading from the above mentioned two junctions meet each other and become continuous with each other, thereby resulting in a p-type well that is entirely changed into a depletion layer. As a result, an electric field intensity at an edge of a drain region is relaxed, thereby providing a field effect transistor having an enhanced breakdown voltage without ON-resistance being increased.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Applications Nos. 8-33521 and 8-33522, both filed on Feb. 21, 1996 each a including a specification, claims, drawings and a summary, is incorporated herein by reference in its entirety.

What is claimed is:

1. A field effect transistor comprising:
(a) a first conductivity type semiconductor substrate;
(b) a second conductivity type well formed at a surface of said substrate;
(c) a first conductivity type well having depth and form at a surface of said second conductivity type well, wherein said first conductivity type well has an impurity concentration profile in a depthwise direction relative to said surface of said second conductivity type well, and has a maximum impurity concentration at a depth deeper than surface of said semiconductor substrate;
(d) a second conductivity type source region formed at a surface of said first conductivity type well;
(e) a second conductivity type drain region formed at a surface of said second conductivity type well;
(f) a gate insulating film formed at a surface of said first conductivity type semiconductor substrate between said source and drain regions;
(g) a gate electrode formed on said gate insulating film;
(h) a source electrode formed on said source region; and
(i) a drain electrode formed on said drain region.

2. The field effect transistor as set forth in claim 1, wherein said maximum impurity concentration of said first conductivity type well is located at a depth deeper than said second conductivity type source region.

3. The field effect transistor as set forth in claim 1, wherein said maximum impurity concentration of said first conductivity type well is at bottom of said first conductivity type well.

4. The field effect transistor as set forth in claim 1, wherein impurity concentration profile of said first conductivity type well is controlled by ion implantation.

5. A field effect transistor comprising:
(a) a first conductivity type semiconductor substrate;
(b) a second conductivity type well formed at a surface of said substrate;
(c) a first conductivity type well having depth and formed at a surface of said second conductivity type well, wherein said first conductivity type well has an impurity concentration profile that increase in a depthwise direction relative to said surface of second conductivity type well, and has a maximum impurity concentration at a depth deeper than said surface of said semiconductor substrate;
(d) a second conductivity type source region formed at a surface of said first conductivity type well;
(e) a second conductivity type drain region formed at a surface of said semiconductor substrate so that said drain region lies across said second conductivity type well and said first conductivity type well;
(f) a gate insulating film formed at a surface of said first conductivity type semiconductor substrate between said source and drain regions;
(g) a gate electrode formed on said gate insulating film;
(h) a source electrode formed on said source region; and
(i) a drain electrode formed on said drain region.

6. The field effect transistor as set forth in claim 5, wherein said maximum impurity concentration of said first conductivity type well is located at a depth deeper than said second conductivity type source region.

7. The field effect transistor as set forth in claim 5, wherein said maximum impurity concentration of said first conductivity type well is at the bottom of said first conductivity type well.

8. The field effect transistor as set forth in claim 5, where impurity concentration profile of said first conductivity type well is controlled by ion implantation.

9. The field effect transistor as set forth in claim 5, wherein a said first conductivity type well impurity concentration profile is such that a portion of said first conductivity type well, sandwiched between said drain region and said second conductivity type well is a depletion layer in its entirety when a predetermined reverse voltage is applied across said source and drain regions.

10. A field effect transistor comprising:
(a) a first conductivity type semiconductor substrate;
(b) a second conductivity type well formed at a surface of said substrate;
(c) a first conductivity type well having depth and formed at a surface of said second conductivity type well, wherein said first conductivity type well has an impurity concentration profile that increase in a depthwise direction relative to said surface of said second conductivity type well, and has a maximum impurity concentration at a depth deeper than surface of said semiconductor substrate;
(d) a second conductivity type source region formed at a surface of said first conductivity type well;
(e) a second conductivity type drain region formed at a surface of said second conductivity type well;
(f) a gate insulating film formed at a surface of said first conductivity type semiconductor substrate between said source and drain regions;
(g) a gate electrode formed on said gate insulating film;
(h) a source electrode formed on said source region; and
(i) a drain electrode formed on said drain region so that said drain electrode is in electrical connection with said second conductivity type well.

11. The field effect transistor as set forth in claim 10, wherein said maximum impurity concentration of said first conductivity type well is located at a depth deeper than said second conductivity type source region.

12. The field effect transistor as set forth in claim 10, wherein said maximum impurity concentration of said first conductivity type well is at a bottom of said first conductivity type well.

13. The field effect transistor as set forth in claim 10, wherein impurity concentration profile of said first conductivity type well is controlled by ion implantation.

14. The field effect transistor as set forth in claim 10, wherein said first conductivity type well impurity concentration profile is such that a portion of said first conductivity type well sandwiched between said drain region and said second conductivity type well is a depletion layer in its entirety when a predetermined reverse voltage is applied across said source and drain regions.

15. A field effect transistor comprising:

(a) a first conductivity type semiconductor substrate;

(b) a second conductivity type well formed at a surface of said substrate;

(c) a first conductivity type well formed at a surface of said second conductivity type well;

(d) a second conductivity type source region formed at a surface of said first conductivity type well;

(e) a second conductivity type drain region formed at a surface of said semiconductor substrate so that said drain region lies across said second conductivity type well and said first conductivity type well;

(f) a gate insulating film formed on said first conductivity type well between said source region and said drain region;

(g) a gate electrode formed on said gate insulating film;

(h) a source electrode formed on said source region; and (i) a drain electrode formed on said drain region.

16. The field effect transistor as set forth in claim 15, wherein said first conductivity type well impurity concentration profile is such that a portion of said first conductivity type well, sandwiched between said drain region and said second conductivity type well is a depletion layer in its entirety when a predetermined reverse voltage is applied across said source and drain regions.

17. A field effect transistor comprising:

(a) a first conductivity type semiconductor substrate;

(b) a second conductivity type well formed at a surface of said substrate;

(c) a first conductivity type well formed at a surface of said second conductivity type well;

(d) a second conductivity type source region formed at a surface of said first conductivity type well;

(e) a second conductivity type drain region formed at a surface of said first conductivity type well; (f) a gate insulating film formed on said first conductivity type well between said source and drain regions;

(g) a gate electrode formed on said gate insulating film;

(h) a source electrode formed on said source region; and (i) a drain electrode formed on said drain region so that said drain electrode is in electrical connection with said second conductivity type well.

18. The field effect transistor as set forth in claim 17, wherein said first conductivity type well impurity concentration profile is such that a portion of said first conductivity type well, sandwiched between said drain region and said second conductivity type well is a depletion layer in its entirety when a predetermined reverse voltage is applied across said source and drain regions.

* * * * *